United States Patent
Yagi et al.

(10) Patent No.: US 6,869,822 B2
(45) Date of Patent: Mar. 22, 2005

(54) METHOD OF MAKING A SEMICONDUCTOR DEVICE WITH ADHESIVE SEALING SUBJECTED TO TWO-FOLD HARDENING

(75) Inventors: Tomohisa Yagi, Kawasaki (JP);
Nobuhiro Imaizumi, Kawasaki (JP);
Yasuhiro Usui, Kawasaki (JP); Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/105,287

(22) Filed: Mar. 26, 2002

(65) Prior Publication Data

US 2003/0049888 A1 Mar. 13, 2003

(30) Foreign Application Priority Data

Sep. 11, 2001 (JP) .......................................... 2001-275238

(51) Int. Cl.[7] .............................................. H01L 21/44
(52) U.S. Cl. ........................ 438/106; 438/107; 438/108; 438/127; 438/612; 438/613
(58) Field of Search ................................ 438/612–617, 438/106–108, 124

(56) References Cited

U.S. PATENT DOCUMENTS

| | | |
|---|---|---|
| 5,261,156 A | 11/1993 | Mase et al. |
| 6,037,043 A | 3/2000 | Lehner et al. |
| 6,071,371 A | 6/2000 | Leonard et al. |
| 6,191,952 B1 * | 2/2001 | Jimarez et al. ............. 361/771 |
| 6,258,626 B1 * | 7/2001 | Wang et al. ................ 438/107 |
| 6,489,380 B1 * | 12/2002 | Zhou et al. ................. 523/427 |

FOREIGN PATENT DOCUMENTS

| | | |
|---|---|---|
| EP | 0 387 066 | 9/1990 |
| EP | 0 501 734 | 9/1992 |
| JP | 9-36177 | 2/1997 |
| JP | 11-106480 | 4/1999 |
| JP | 11-106481 | 4/1999 |
| JP | 2000-195904 | 7/2000 |
| WO | WO 98 31738 | 7/1998 |

OTHER PUBLICATIONS

Patent Abstracts of Japan, vol. 2000, no. 18, JP 2001 024029 A (NEC CORP), Jan. 26, 2001 * abstract *.

* cited by examiner

*Primary Examiner*—Thanh Nguyen
(74) *Attorney, Agent, or Firm*—Armstrong, Kratz, Quintos, Hanson & Brooks, LLP

(57) ABSTRACT

According to a method of making a semiconductor device, a semiconductor chip is bonded to a substrate via bumps by flip-chip bonding. Then, a sealing adhesive composition is loaded between the semiconductor chip and the substrate to provide an adhesive sealing. The sealing adhesive composition, which is capable of hardening in two stages, contains at least a first main resin ingredient, a second main resin ingredient and a hardening agent. Then, the adhesive sealing is heated for primary hardening. Then, the substrate is placed on a mother board with a solder material interposed between the substrate and the mother board. Finally, the adhesive sealing is heated for secondary hardening while the solder material is reflowed for bonding the substrate to the mother board.

13 Claims, 1 Drawing Sheet

METHOD OF MAKING A SEMICONDUCTOR DEVICE WITH ADHESIVE SEALING SUBJECTED TO TWO-FOLD HARDENING

BACKGROUND OF THE INVENTION

1. Field of the Invention

The present invention relates to a method of making a semiconductor device of the type which comprises a semiconductor chip bonded to a substrate by flip-chip bonding with an adhesive sealing interposed between the semiconductor chip and the substrate. The present invention also relates to a semiconductor device made by such a method.

2. Description of the Related Art

In a semiconductor device for use in a high-end apparatus such as a super computer, an LSI chip is bonded to an MCM (Multi-Chip Module) substrate by flip-chip bonding using solder bumps for realizing a high performance and high-density mounting. Generally, in the flip-chip bonding, a gap between the LSI chip and the MCM substrate is sealed with a resin for preventing air or dust from entering the gap.

Recently, the flip-chip bonding is increasingly utilized also for making a semiconductor device for use in a middle-end or low-end apparatus. In such a semiconductor device, a substrate such as a buildup substrate or a glass ceramic substrate is often used for mounting an LSI chip to realize a cost reduction. However, a substrate of these kinds differs largely from an LSI chip in coefficient of thermal expansion, which may lead to the generation of large thermal stresses and thereby result in unexpected detachment of solder bumps from the electrodes of the substrate and/or the electrodes of the chip. Therefore, in a semiconductor device for use in a middle-end or low-end apparatus, the adhesive sealing at the bond gap is required to enhance the bonding reliability between the chip and the substrate in addition to preventing the entry of air and/or dust.

For example, JP-A-11-106480 and JP-A-11-106481 propose the use of a sealing adhesive having a relatively high adhesion for enhancing the bonding reliability between the substrate and the chip.

To provide a semiconductor device, an LSI chip is mounted to a substrate by flip-chip bonding, and the bonded portion is sealed with a resin. The assembly of the LSI chip and the substrate is then mounted to a mother board with the substrate oriented toward the mother board, thereby providing a semiconductor device. In mounting the chip-substrate assembly to the mother board, use may be made of BGA (Ball Grid Array), CSP (Chip Scale Package) or PGA (Pin Grid Array) for mounting the substrate to the mother board via arrays of solder bumps or arrays of solder pins. In any of these, the chip-substrate assembly and the mother board are bonded by reflowing the solder bumps or pins. Thus, the chip-substrate assembly is subjected to heating at a high temperature. As a result, the adhesive sealing may suffer cracks and/or release from the substrate and/or the chip due to the deformation of the LSI chip and the substrate or due to thermal stresss generated in the adhesive sealing. This may lead to removal of the solder bumps or pins, which may, in turn, cause damage to the chip electrodes. Such a damage is remarkable at the electrodes provided at a peripheral portion of the LSI chip, because the LSI chip warps largely at the peripheral portion. Moreover, the bumps for bonding the chip to the substrate may be re-melted by the reflow heating and flow into the cracks formed in the adhesive sealing or the removed portion of the adhesive sealing. This may cause adjacent bumps to be electrically connected to each other to result in shorting of the bumps. In this way, the prior art methods for making a semiconductor device are still insufficient in terms of the bonding reliability between the LSI chip and the substrate.

SUMMARY OF THE INVENTION

It is therefore an object of the present invention to provide a method of making a semiconductor device which provides a highly reliable bond between a semiconductor chip and a substrate even if the chip-substrate assembly is later heated for mounting to a mother board by reflow soldering.

Another object of the present invention is to provide a semiconductor device made by such a method.

In accordance with a first aspect of the present invention, a method is provided for making a semiconductor device. According to the method, a semiconductor chip is first bonded to a substrate via bumps by flip-chip bonding. Then, a sealing adhesive composition is loaded between the semiconductor chip and the substrate to provide an adhesive sealing. The sealing adhesive composition contains at least a first main resin ingredient, a second main resin ingredient and a hardening agent, so that the sealing adhesive composition is capable of hardening in two stages. Then, the adhesive sealing is heated for primary hardening. Then, the chip-substrate assembly is placed on a mother board with a solder material interposed between the substrate and the mother board. Finally, the adhesive sealing is heated for secondary hardening while the solder material is reflowed for bonding the chip-substrate assembly to the mother board.

With this method, the reliability of the bond between the semiconductor chip and the substrate does not deteriorate in mounting the substrate to a mother board by reflow soldering. The sealing adhesive composition for sealing between the semiconductor chip and the substrate hardens in two stages. Specifically, the first main ingredient of the sealing adhesive composition undergoes the primary hardening before bonding the substrate (i.e., the bonded assembly of the semiconductor device and the substrate) onto the mother board, thereby protecting the flip-chip bond. Herein, the primary hardening means the state where the hardening reaction occurs with respect to the first main ingredient but hardly occurs with respect to the second main ingredient which therefore retains its uncured state. Then, due to the heat of reflow soldering for mounting the chip-substrate assembly to the mother board, the adhesive sealing undergoes the secondary hardening. Specifically, the uncured second main ingredient of the sealing adhesive composition first softens upon heating, so that the entire adhesive sealing softens once, followed by the secondary hardening of the second main ingredient. During the preliminary softening of the adhesive sealing, the thermal stresses previously generated at the adhesive sealing after the primary hardening are relieved. Therefore, in the reflow soldering, undesirable stress is not transmitted from the adhesive sealing to the substrate or the semiconductor chip. Thus, it is possible to prevent unexpected removal of the adhesive sealing from the substrate or the semiconductor chip.

According to the prior art, the adhesive sealing provided at the flip-chip bonded portion is completely hardened by heat before the chip-substrate assembly is mounted to a motherboard. Therefore, when the adhesive sealing is subjected to a high temperature during the reflow soldering for mounting the chip-substrate assembly to the mother board, the adhesive sealing may be removed from the substrate or the semiconductor chip due to the thermal stresses generated in the adhesive sealing. According to the present invention, on the other hand, the secondary hardening of the adhesive sealing occurs during the heating for reflow soldering so that the thermal stresses generated in the adhesive sealing can be relieved. Thus, the present invention can prevent the above-described drawbacks of the prior art.

The first main ingredient of the sealing adhesive composition according to the present invention may be such that it hardens at a first temperature (primary hardening temperature) which is lower than the melting point of the solder material, whereas the second main ingredient of the sealing adhesive composition may be such that it hardens at a second temperature (secondary hardening temperature) which is equal to or higher than the melting point of the solder material. Examples of the first main resin ingredient include a bisphenol resin (e.g. bisphenol F resin, bisphenol A resin), a cycloaliphatic epoxy resin and a naphthalene resin. A preferable example of the second main resin ingredient is a cyanate resin such as a cyanate ester resin.

For the hardening agent for the sealing adhesive composition, use may be made of 4,4'-dihydroxybiphenyl, nonyl phenol or tetramethyl bishphenol A for example.

Preferably, the sealing adhesive composition exhibits at least two peak temperatures in differential scanning calorimetry. More preferably, the sealing adhesive composition includes a lower peak temperature lying in a range of 110–170° C. and a higher peak temperature lying in a range of 180–240° C. Such peak temperature setting makes it possible to perform the two-stage hardening of the adhesive sealing in an appropriate manner.

Preferable examples of the hardening agent to be contained the sealing adhesive composition include 4,4'-dihydroxy biphenyl, nonyl phenol and tetramethyl bishphenol A. Like the main resin ingredients, the selection of the hardening agent is critically important because the two different main resin ingredients may harden in the same temperature range if the hardening agent is improperly selected. For the present invention, the hardening agent should preferably provide a low hardening speed.

The sealing adhesive composition may further contain an inorganic filler, and the method may further comprise the step of settling the inorganic filler toward the substrate for forming a two-layer structure in the adhesive sealing. In this case, the inorganic filler settling step is performed before the primary hardening step for the adhesive sealing.

Preferably, the inorganic filler may be either silica powder, alumina powder or a combination of these.

For improving affinity between the inorganic filler and the resin ingredients, the sealing adhesive composition may further contain a coupling agent. Examples of the coupling agent include vinyltrichlorosilane, vinyl tris-(2-methoxyethoxy) silane, γ-methacryloxypropyl trimethoxy silane, γ-methacryloxypropyl triethoxy silane, β-(3,4-epoxycyclohexyl) ethyl trimethoxy silane, γ-glycidoxypropyl trimethoxy silane, γ-glycidoxypropyl triethoxy silane, γ-chloropropyl trimethoxy silane, γ-mercaptopropyl trimethoxy silane, γ-aminopropyl triethoxy silane, N-phenyl-γ-aminopropyl trimethoxy silane, N-β-aminoethyl-γ-aminopropyl trimethoxy silane, and N-β-aminoethyl-γ-aminopropyl methyl dimethoxy silane.

Preferably, the sealing adhesive composition has a viscosity of not more than 1,000 cps at 100° C., and the sealing adhesive composition gels after lapse of not less than three minutes at a heating temperature for the primary hardening. These requirements need to be met for appropriately settling the inorganic filler.

According to a second aspect of the present invention, a semiconductor device is provided which comprises a substrate, a semiconductor chip bonded to the substrate via bumps, and an adhesive sealing formed between the substrate and the semiconductor chip. The adhesive sealing contains at least at least a first main resin ingredient and a second main resin ingredient both of which are hardened by a hardening agent selected from the group consisting of 4,4'-dihydroxybiphenyl, nonyl phenol and tetramethyl bishphenol A. The first main resin ingredient is selected from the group consisting of a bisphenol resin, a cycloaliphatic epoxy resin and a naphthalene resin.

According to a third aspect of the present invention, a semiconductor device is provided which comprises a substrate, a semiconductor chip bonded to the substrate via bumps, and an adhesive sealing formed between the substrate and the semiconductor chip. The adhesive sealing contains an inorganic filler. Further, the adhesive sealing includes a first portion adjoining the substrate and containing the inorganic filler at a higher density, and a second portion adjoining the semiconductor chip and containing the inorganic filler at a lower density.

According to the third aspect, the adhesive sealing comprises a first portion containing the inorganic filler at a higher density and thereby having a higher modulus of elasticity, and a second portion containing the inorganic filler at a lower density and thereby having a lower modulus of elasticity. Therefore, in the reflow heating, the second portion having a lower modulus of elasticity serves as a cushion for alleviating stresss applied from the adhesive sealing toward the semiconductor chip. As a result, the breakage of the bond between the chip electrodes and the bumps can be prevented, thereby providing a high bonding reliability of the semiconductor chip relative to the substrate.

Other objects, features and advantages of the present invention will become apparent from the following detailed description of the preferred embodiments given with reference to the accompanying drawings.

DETAILED DESCRIPTION OF THE PREFERRED EMBODIMENTS

Preferred embodiments of the present invention will be described below in detain with reference to FIGS. 1a–1d.

Figure 1A:
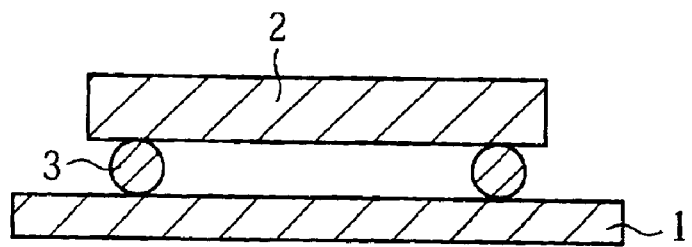
FIGS. 1a through 1d illustrate the successive process steps for making a semiconductor device in accordance with an embodiment of the present invention.

First, as shown in FIG. 1a, a semiconductor chip 2 is bonded onto a substrate 1 via solder bumps 3 (flip-chip bonding). The semiconductor chip 2 has a lower surface provided with a plurality of electrodes (not shown), whereas the substrate 1 has an upper surface formed with a wiring pattern (not shown). As a result of this flip-chip bonding, the electrodes of the semiconductor chip 2 are electrically connected to the wiring pattern of the substrate 1 via the solder bumps 3. In this state, a small gap is defined between the substrate 1 and the chip 2.

Figure 1B:
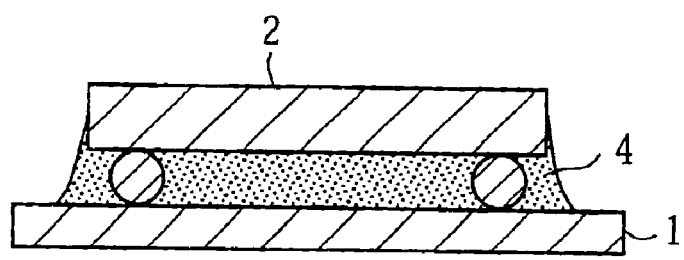

Then, as shown in FIG. 1b, an uncured sealing adhesive composition held at a temperature of about 70° C. is injected into the gap between the substrate 1 and the semiconductor chip 2 to provide an adhesive sealing 4. The sealing adhesive composition used herein is so composed as to provide two discernable peak temperatures in differential scanning calorimetry. Specifically, the sealing adhesive composition contains bisphenol F resin (and/or naphthalene resin) as a first main resin ingredient, cyanate resin as a second main resin ingredient, and a hardening agent of a relatively low hardening speed such as 4,4'-dihydroxy biphenyl or nonyl phenol for example. The sealing adhesive composition also contains an inorganic filler such as silica powder and/or alumina powder.

Figure 1C:
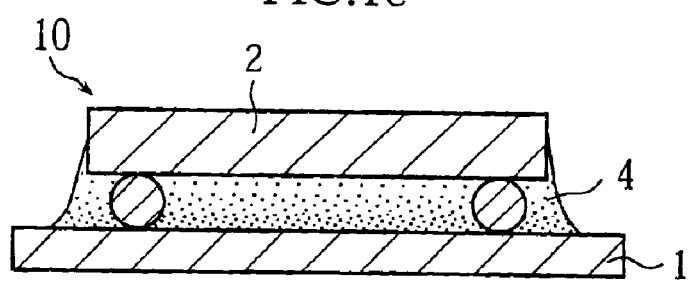

After the inorganic filler contained in the adhesive sealing 4 is sufficiently settled, the adhesive sealing 4 is heated to a temperature of e.g. 150° C. for primary hardening, as shown in FIG. 1c. In the primary hardening, the hardening reaction (polymerization) progresses mainly with respect to the first main resin ingredient whose hardening temperature is relatively low, whereas the hardening reaction hardly takes place with respect to the second main resin ingredient. In this way, a chip-substrate assembly 10 is prepared which comprises the semiconductor chip 2 bonded to the substrate 1 by the flip-chip bonding with the adhesive sealing 4 interposed between the chip 2 and the substrate 1.

Figure 1D:
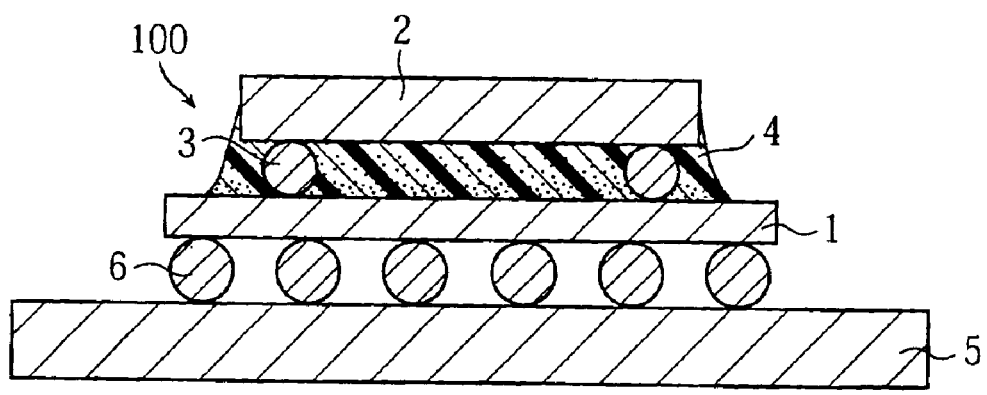

Subsequently, arrays of bumps 6 are formed on the substrate 1, and the chip-substrate assembly 10 is mounted on a mother board 5 via the bumps 6 by reflow soldering, as shown in FIG. 1d. In the reflow soldering, the chip-substrate assembly 10 provided with the bumps 6 is heated to a temperature which is equal to or higher than the melting point of the solder material of the bumps 9 and which is capable of causing the adhesive sealing 4 to undergo secondary hardening. By this secondary heating, the bumps 6 are re-melted to bond the chip-substrate assembly 10 to the mother board 5. Further, in the course of heating for the secondary hardening, the adhesive sealing 4 is once softened and then hardened while relieving the thermal stresses generated in the primary hardening. Since the thermal stresses are relieved from the adhesive sealing 4 in the secondary hardening, the adhesive sealing 4 is prevented from suffering cracks or unexpected detachment from the chip 2 and the substrate 1. Therefore, the semiconductor chip 2 can be reliably bonded to the substrate 1, thereby providing a good semiconductor device 100.

Next, description is made as to specific examples of the present invention and comparative examples.

EXAMPLE 1

(Preparation of Sealing Adhesive Composition)

A sealing adhesive composition was prepared by mixing 100 parts by weight of bisphenol F resin (EXA-830 available from Dainippon Ink and Chemicals, Incorporated) as a first main resin ingredient, 100 parts by weight of cyanate ester resin (L10 available from Asahi Kasei Epoxy Corporation) as a second main resin ingredient, 15 parts by weight of 4,4'-dihydroxy biphenyl (available from Wako Pure Chemicals Industries, Ltd.) as a hardening agent, 370 parts by weight of silica filler (SO-E5 available from Admatechs Co., Ltd.) as an inorganic filler, 1 parts by weight of γ-grycidoxy propyl trimethoxy silane (KBM403 available from Shin-Etsu Chemical Co., Ltd.) as a first coupling agent, and 1 parts by weight of γ-mercapto propyl trimethoxy silane (KBM803 available from Shin-Etsu Chemical Co., Ltd.) as a second coupling agent.

(Differential Scanning Calorimetry)

The hardening behavior of the sealing adhesive composition was thermodynamically determined using a differential scanning calorimeter (DSC100 available from Seiko Instruments Inc.). In the measurement, the sealing adhesive composition was heated at an increasing rate of 5° C. /min, and a temperature range of 25–280° C. was scanned. In the DSC chart obtained by the measurement, the sealing adhesive composition exhibited two peak temperatures one of which was 153° C. attributable to bisphenol F resin, whereas the other peak was 197° C. originating from cyanate ester resin. The two peaks were thermodynamically discernable from each other. The results are given in Table 1. In this way, it has been found that the hardening reaction of the sealing adhesive composition of Example 1 progresses in two stages.

(Measurement of Glass Transition Point)

The glass transition point of the sealing adhesive composition was determined using a viscoelastic measuring instrument (DMS110 available from Seiko Instruments Inc.). The measurement was performed with respect to two samples of the sealing adhesive composition. One sample had undergone only the primary heating performed at 150° C. for 120 minutes, whereas the other sample had undergone the secondary heating performed at 245° C. for 90 seconds after the primary heating. In the measurement, the two samples were heated while increasing the heating temperature at a rate of 5° C. /min in a temperature range of 25–300° C. As a result, the glass transition point of the sample which had undergone only the primary heating was 158° C., whereas the glass transition point of the sample which had additionally undergone the secondary heating was 172° C. The results are given in Table 1. In this way, it has been found that the hardening reaction of the sealing adhesive composition further progresses due to the secondary heating.

(Test for Thermal Stress Influences)

An LSI chip (20×20 mm) was bonded to a buildup substrate (50×50×15 mm) by flip-chip bonding via 4,000 solder bumps (pitch: 225 μm) of Sn-3.2%Ag-0.7%Cu (melting point: 214° C.). Then, the gap between the substrate and the chip was sealed with the above-described sealing adhesive composition while holding the substrate at 70° C. Subsequently, the primary heating was performed at 150° C. for two hours to carry out the primary hardening of the adhesive sealing. Then, the reflow heating (or secondary heating) was performed two times at 245° C. for 90 seconds, which simulates the actual mounting of BGA balls and mounting to a mother board. Then, the substrate was removed by plane grinding to check the exposed surface for the bump condition and the adhesive sealing removal. In the test, neither the adhesive sealing removal nor short-circuiting between the solder bumps was observed.

Further, damage to the LSI chip electrodes was also checked by vertically grinding another sample of chip-substrate assembly having a laminated structure of a substrate, an adhesive sealing and an LSI chip provided by the above-described process steps. As a result, no damage was found at the connection between the electrodes and the bumps, and the bumps were not removed from the chip electrodes.

The results are given in FIG. 1.

(Determination of Gel Time)

The gel time of the sealing adhesive composition upon heating at 150° C. (the primary heating temperature) was measured using a gel time tester (153-GTR available from Yasuda Seiki Ltd.). The gel time is the time required for gelling of the resin composition. The gel time of the sealing adhesive composition in Example 1 was 3 minutes, which is given in Table 1.

(Determination of Viscosity)

The viscosity of the sealing adhesive composition at 100° C. was measured using a rheometer (RDA-III available from Rheometric Scientific F.E. Ltd.). The viscosity of the sealing adhesive composition in Example 1 was 850 cps, which is given in Table 1.

(Test for Inorganic Filler Settlement)

An LSI chip (20×20 mm) was bonded to a buildup substrate (50×50×15 mm) via solder bumps of Sn-3.2%Ag-0.7%Cu (melting point: 214° C.). Then, the gap between the substrate and the chip was sealed with the above-described sealing adhesive composition while holding the substrate at 70° C. Subsequently, the primary heating was performed at 150° C. for two hours to carry out the primary hardening of the adhesive sealing. The sample, which had a laminated structure of a substrate, an adhesive sealing and an LSI chip, was vertically ground for checking the settling conditions of the inorganic filler contained in the sealing adhesive composition. As a result, the inorganic filler was settled toward the substrate, and the adhesive sealing had a two-layer structure including a first layer containing a large amount of inorganic filler and a second layer which contains little inorganic filler.

(Temperature Cycle Test)

A temperature cycle test was performed with respect to 25 samples prepared by the same process as that for preparing a sample for checking the thermal stress influences. Specifically, each of the samples was first measured for its initial electric resistance at each of the bump connections. Then, the sample was subjected to temperature cycles ranging from −65 to 125° C. Specifically, a cycle was repeated 2,000 times which consisted of cooling at −65° C. for 15 minutes, leaving at room temperature for 10 minutes and heating at 125° C. for 15 minuets. Thereafter, the electric resistance at each of the bump connections was measured to check for any conduction failure. Further, an increase of the electric resistance was no more than 10%, which was acceptable.

(Humidity Resistance Test)

A humidity resistance test was performed with respect to 25 samples prepared by the same process as that for preparing a sample for checking the thermal stress influences. Specifically, each of the samples was measured for its initial electric resistance at each of the bump connections at an temperature of 25° C. under a relative humidity of 60%. Then, the sample was left at a temperature of 121° C. under a relative humidity of 85%. After elapse of 1,000 hours, the electric resistance at each of the bump connections was measured to check for any conduction failure. Further, an increase of the electric resistance was no more than 10%, which was acceptable.

EXAMPLE 2

A sealing adhesive composition was prepared in a manner similar to Example 1. The difference of the sealing adhesive composition of Example 2 from that of Example 1 lies in that the proportion of bisphenol F resin (EXA-830 available from Dainippon Ink and Chemicals, Incorporated) was reduced to 75 parts by weight, while 25 parts by weight of naphthalene resin (HP4032D available from Dainippon Ink and Chemicals, Incorporated) was further added as a third main resin ingredient. Subsequently, in a manner similar to Example 1, the differential scanning calorimetry and the measurement of glass transition point, gel time and viscosity were performed. Further, samples of chip-substrate assembly each including an adhesive sealing formed of this resin composition were prepared and checked for thermal stress influences, settlement of inorganic filler, temperature cycle resistance and humidity resistance, in the same manner as in Example 1.

In the differential scanning calorimetry, the sealing adhesive composition exhibited two peak temperatures one of which was 146° C. attributable to bisphenol F resin and naphthalene resin, whereas the other peak was 195° C. inherent to cyanate ester resin. The glass transition point after the primary heating was 172° C., whereas the glass transition point after the secondary heating was 186° C. This result revealed that the hardening reaction of the resin composition further progressed due to the secondary heating. The gel time was 3 minutes, and the viscosity was 1,000 cps. In the test for the thermal stress influences, the removal of the adhesive sealing or the short-circuiting between bumps were not observed. Further, the vertical section observation of the substrate-seal-chip laminate revealed no damage to the bond between the electrodes and the bumps. In the test for the inorganic filler settlement, the two-layer structure similar to that of Example 1 was observed. In the temperature cycle test and the humidity resistance test, any conduction failure was not found at all connections of each sample, and an increase of the electric resistance was no more than 10%. These results are given in Table 1.

EXAMPLE 3

A sealing adhesive composition was prepared in a manner similar to Example 1. The difference of the sealing adhesive composition of this Example from that of Example 1 lies in that the proportion of bisphenol F resin (EXA-830 available from Dainippon Ink And Chemicals, Incorporated) was reduced to 50 parts by weight, while 50 parts by weight of naphthalene resin (HP4032D available from Dainippon Ink And Chemicals, Incorporated) was further added as a third main ingredient. Subsequently, in a manner similar to Example 1, the differential scanning calorimetry and the measurement of glass transition point, gel time and viscosity were performed. Further, samples of chip-substrate assembly each including an adhesive sealing formed of this resin composition were prepared and checked for thermal stress influences, settlement of inorganic filler, temperature cycle resistance and humidity resistance, in the same manner as in Example 1.

In the differential scanning calorimetry, the sealing adhesive composition exhibited two peak temperatures one of which was 140° C. attributable to bisphenol F resin and naphthalene resin, whereas the other peak was 194° C. inherent to cyanate ester resin. The glass transition point after the primary heating was 185° C., whereas the glass transition point after the secondary heating was 199° C. This result revealed that the hardening reaction of the resin composition further progressed due to the secondary heating. The gel time was 3 minutes, and the viscosity was 1,150 cps. In the test for the thermal stress influences, the removal of the adhesive sealing or the short-circuiting between bumps were not observed. Further, the vertical section observation of the substrate-seal-chip laminate revealed no damage to the bond between the electrodes and the bumps. In the test for the inorganic filler settlement, the two-layer structure similar to that of Example 1 was observed. In the temperature cycle test and the humidity resistance test, any conduction failure was not found at all connections of each sample, and an increase of the electric resistance was no more than 10%. These results are given in Table 1.

COMPARATIVE EXAMPLE 1

A sealing adhesive composition was prepared in a manner similar to Example 1. The difference of the sealing adhesive composition of this comparative example from that of Example 1 lies in that 15 parts by weight of imidazole (2MZA-PW available from Shikoku Chemicals Corporation) was added as a hardening agent instead of 15 parts by weight of 4,4'-dihydroxybiphenyl (available from Wako Pure Chemicals Industries, Ltd.). Subsequently, in a manner similar to Example 1, the differential scanning calorimetry and the measurement of glass transition point, gel time and viscosity were performed. Further, samples of chip-substrate assembly each including an adhesive sealing formed of this resin composition were prepared and checked for thermal stress influences, settlement of inorganic filler, temperature cycle resistance and humidity resistance, in the same manner as in Example 1.

In the differential scanning calorimetry, the sealing adhesive composition exhibited only one peak temperature of 162° C., indicating that the sealing adhesive composition cannot harden in two stages. Further, the glass transition point did not vary before and after the secondary heating, which was 165° C. This result indicates that the adhesive sealing was almost completely hardened by the primary heating. The gel time was 2 minutes, and the viscosity was 820 cps. In the test for the thermal stress influences, the removal of the adhesive sealing and the short-circuiting between bumps were observed. Further, the vertical section inspection of the substrate-seal-chip laminate revealed damage to the bond between the electrodes and the bumps. Moreover, the inorganic filler did not settle in the filler settlement observation. These results are given

TABLE 1

|  |  | Example 1 | Example 2 | Example 3 | Comparative Example 1 |
| --- | --- | --- | --- | --- | --- |
| Peak Temperature in DSC (° C.) |  | 153 197 | 146 195 | 149 194 | 162 |
| Glass Transition Point (° C.) | After Primary Heating | 158 | 172 | 185 | 165 |
|  | After Secondary Heating | 172 | 186 | 199 | 163 |
| Influences of Thermal Stress | Bump Short-Circuiting | No | No | No | Yes |
|  | Resin Removal | No | No | No | Yes |
|  | Electrode Damage | No | No | No | Yes |
| Gel Time (min.) |  | 3 | 3 | 3 | 2 |
| Viscosity (cps) |  | 850 | 1,000 | 1,150 | 820 |
| Two-layer Structure due to Settling of Inorganic Filler |  | Yes | Yes | No | No |

[Evaluation]

In each of Examples 1–3, since the sealing adhesive composition had two peak temperatures in the differential scanning calorimetry, it is considered to harden in two stages by heating to temperatures corresponding to the peak temperatures. Therefore, in the reflow heating for mounting a chip-substrate assembly onto a mother board, the sealing adhesive composition undergoes secondary hardening. As a result, the thermal stresses generated in the sealing adhesive composition upon primary hardening can be relieved to prevent subsequent removal of the adhesive sealing or short-circuiting between solder bumps.

As opposed to Examples 1–3, the sealing adhesive composition in the comparative example exhibited only a single peak temperature in the differential scanning calorimetry, so that it cannot harden in two stages. Therefore, the thermal stresses generated in the sealing adhesive composition upon hardening cannot be relieved at the time of reflow heating for mounting a chip-substrate assembly onto a mother board. This causes unexpected removal of the adhesive sealing and short-circuiting between solder bumps.

The present invention being thus described, it should be understood that the same may be varied in many ways. Such variations should not be regarded as a departure from the spirit and scope of the present invention, and all such modifications and variations as would be obvious to those skilled in the art are intended to be covered by the appended claims.

What is claimed is:

1. A method of making a semiconductor device comprising the steps of:

bonding a semiconductor chip to a first substrate via first bumps;

loading a sealing adhesive composition between the semiconductor chip and the first substrate to provide an adhesive sealing, the sealing adhesive composition containing at least a first main resin ingredient, a second main resin ingredient and a hardening agent, the sealing adhesive composition being capable of hardening in two stages;

heating the adhesive sealing at a primary heating temperature for primary hardening;

placing the first substrate on a second substrate with a second bumps interposed between the first substrate and the second substrate; and heating the adhesive sealing at a secondary heating temperature higher than the primary heating temperature for secondary hardening of the sealing adhesive composition due to hardening of the second main resin ingredient following preliminary softening of the adhesive sealing, while melting the second bumps for bonding the first substrate to the second substrate.

2. The method of making a semiconductor device according to claim 1, wherein the sealing adhesive composition exhibits at least two peak temperatures in differential scanning calorimetry.

3. The method of making a semiconductor device according to claim 2, wherein the two peak temperatures include a lower peak temperature lying in a range of 110–170° C. and a higher peak temperature lying in a range of 180–240° C.

4. The method of making a semiconductor device according to claim 2, wherein the first main resin ingredient of the sealing adhesive composition is selected from the group consisting of a bisphenol resin, a cycloaliphatic epoxy resin and a naphthalene resin.

5. The method of making a semiconductor device according to claim 2, wherein the second main resin ingredient of the sealing adhesive composition comprises a cyanate resin.

6. The method of making a semiconductor device according to claim 5, wherein the cyanate resin comprises a cyanate ester resin.

7. The method of making a semiconductor device according to claim 1, wherein the hardening agent of the sealing adhesive composition is selected from the group consisting of 4,4'-dihydroxybiphenyl, nonyl phenol and tetramethyl bishphenol A.

8. The method of making a semiconductor device according to claim 1, wherein the sealing adhesive composition further contains an inorganic filler, the method further comprising the step of settling the inorganic filler toward the first substrate for forming a two-layer structure in the adhesive sealing, the inorganic filler settling step being performed before the primary hardening step for the adhesive sealing.

9. The method of making a semiconductor device according to claim 8, wherein the inorganic filler is selected from the group consisting of silica powder and alumina powder.

10. The method of making a semiconductor device according to claim 8, wherein the sealing adhesive composition further contains a coupling agent.

11. The method of making a semiconductor device according to claim 10, wherein the coupling agent is selected from the group consisting of vinyltrichlorosilane, vinyl tris-(2-methoxyethoxy) silane, γ-methacryloxypropyl trimethoxy silane, γ-methacryloxypropyl triethoxy silane, β-(3,4-epoxycyclohexyl) ethyl trimethoxy silane, γ-glycidoxypropyl trimethoxy silane, γ-glycidoxypropyl triethoxy silane, γ-chloropropyl trimethoxy silane, γ-mercaptopropyl trimethoxy silane, γ-aminopropyl triethoxy silane, N-phenyl-γ-aminopropyl trimethoxy silane, N-β-aminoethyl-γ-aminopropyl trimethoxy silane, and N-β-aminoethyl-γ-aminopropyl methyl dimethoxy silane.

12. The method of making a semiconductor device according to claim 1, wherein the sealing adhesive composition has a viscosity of not more than 1,000 cps at 100° C.

13. The method of making a semiconductor device according to claim 1, wherein the sealing adhesive composition gels after lapse of not less than three minutes the primary heating temperature for the primary hardening.

* * * * *